United States Patent [19]
Whybrew et al.

[11] Patent Number: 6,097,260
[45] Date of Patent: Aug. 1, 2000

[54] DISTRIBUTED GROUND PADS FOR SHIELDING CROSS-OVERS OF MUTUALLY OVERLAPPING STRIPLINE SIGNAL TRANSMISSION NETWORKS

[75] Inventors: Walter M. Whybrew, Palm Bay; Jeffery C. May; Douglas E. Heckaman, both of Indialantic, all of Fla.

[73] Assignee: Harris Corporation, Melbourne, Fla.

[21] Appl. No.: 09/009,861

[22] Filed: Jan. 22, 1998

[51] Int. Cl.[7] .................................. H01P 3/08; H01P 5/12
[52] U.S. Cl. ........................ 333/1; 333/128; 333/136; 333/246
[58] Field of Search ....................... 333/1, 238, 246, 333/128, 136

[56] References Cited

U.S. PATENT DOCUMENTS

| | | | |
|---|---|---|---|
| 3,104,363 | 9/1963 | Butler | 333/246 |
| 4,533,883 | 8/1985 | Hudspeth et al. | 333/1 |
| 5,003,273 | 3/1991 | Oppenberg | 333/1 |
| 5,021,755 | 6/1991 | Gustafson | 333/128 |
| 5,117,207 | 5/1992 | Powell et al. | 333/1 |
| 5,153,602 | 10/1992 | DuBois et al. | 343/853 |
| 5,296,651 | 3/1994 | Gurrie et al. | 174/254 |
| 5,600,285 | 2/1997 | Sachs et al. | 333/1 |

FOREIGN PATENT DOCUMENTS

| | | | |
|---|---|---|---|
| 178703 | 9/1985 | Japan | 333/246 |

*Primary Examiner*—Benny Lee
*Attorney, Agent, or Firm*—Charles E. Wands

[57] ABSTRACT

A distributed ground pad-based isolation arrangement for a multilayer stripline architecture is configured to effectively inhibit the mutual coupling of signals between overlapping regions of adjacent stripline networks of dielectrically separated transmission networks, without substantially increasing either the mass of the laminate structure or the lossiness of the stripline. At regions of mutual overlap, the stripline layers are spatially oriented at right angles to one another, and a limited area ground pad is interleaved between the stripline layers. To maintain the desired characteristic line impedance of a stripline layer as it passes over a ground pad, the width of the stripline layer is reduced in the overlap region. Each ground pad is connected to an external ground reference by plated vias, that extend through the dielectric layers and intersect outer grounded shielding layers of the laminate.

8 Claims, 4 Drawing Sheets

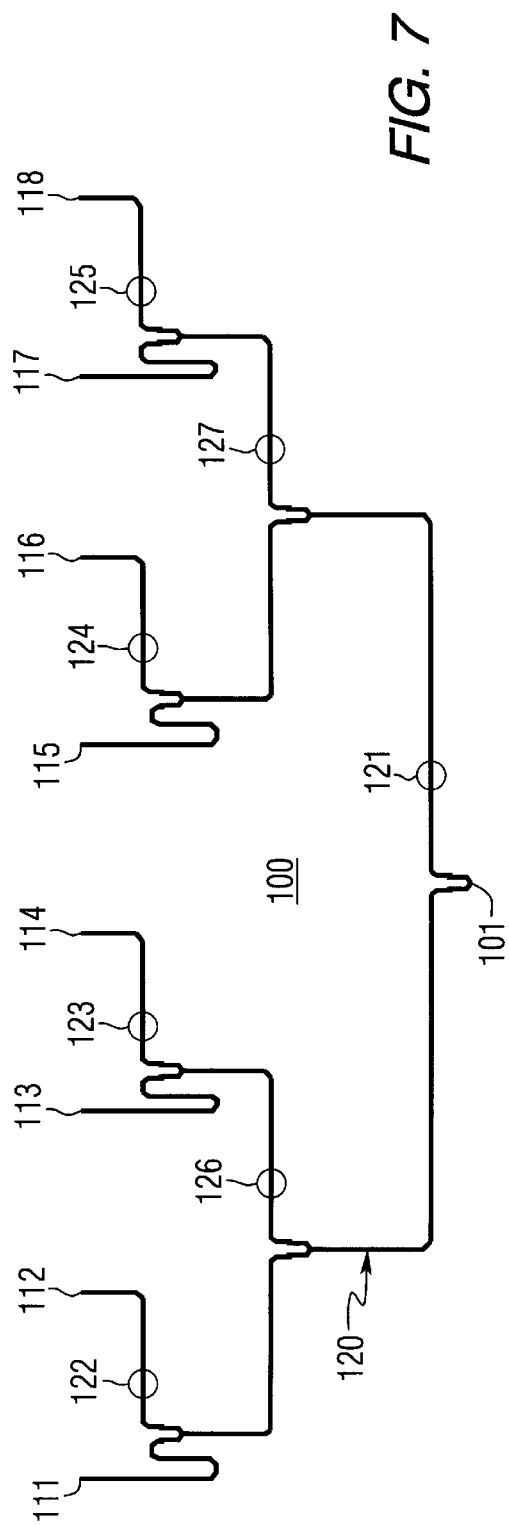
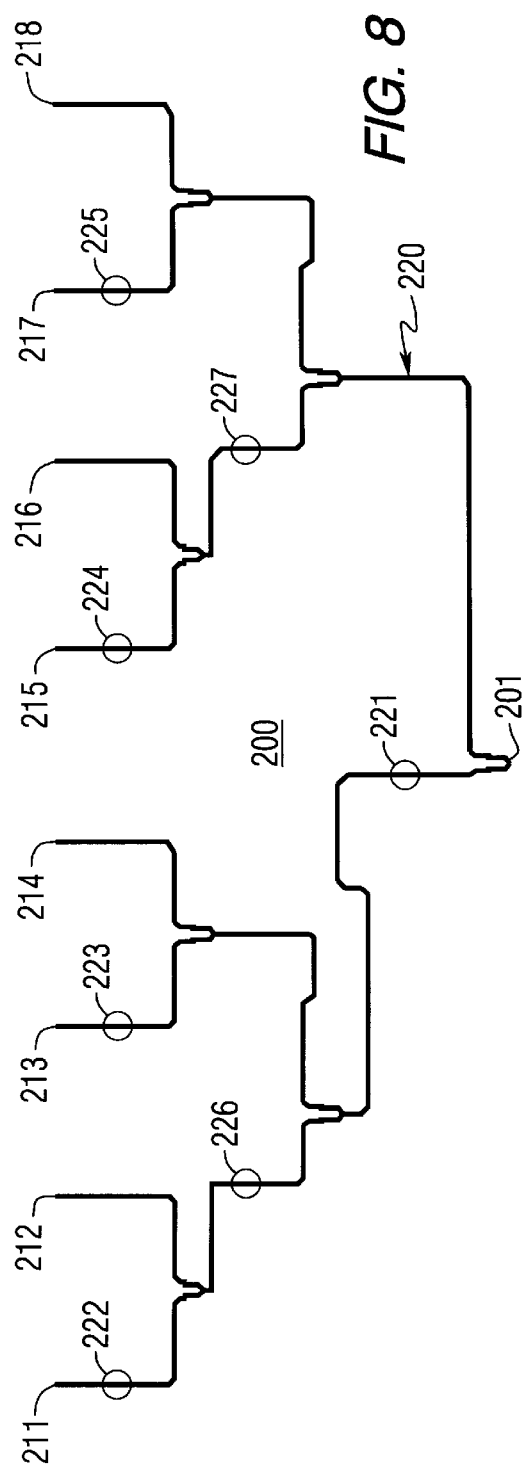

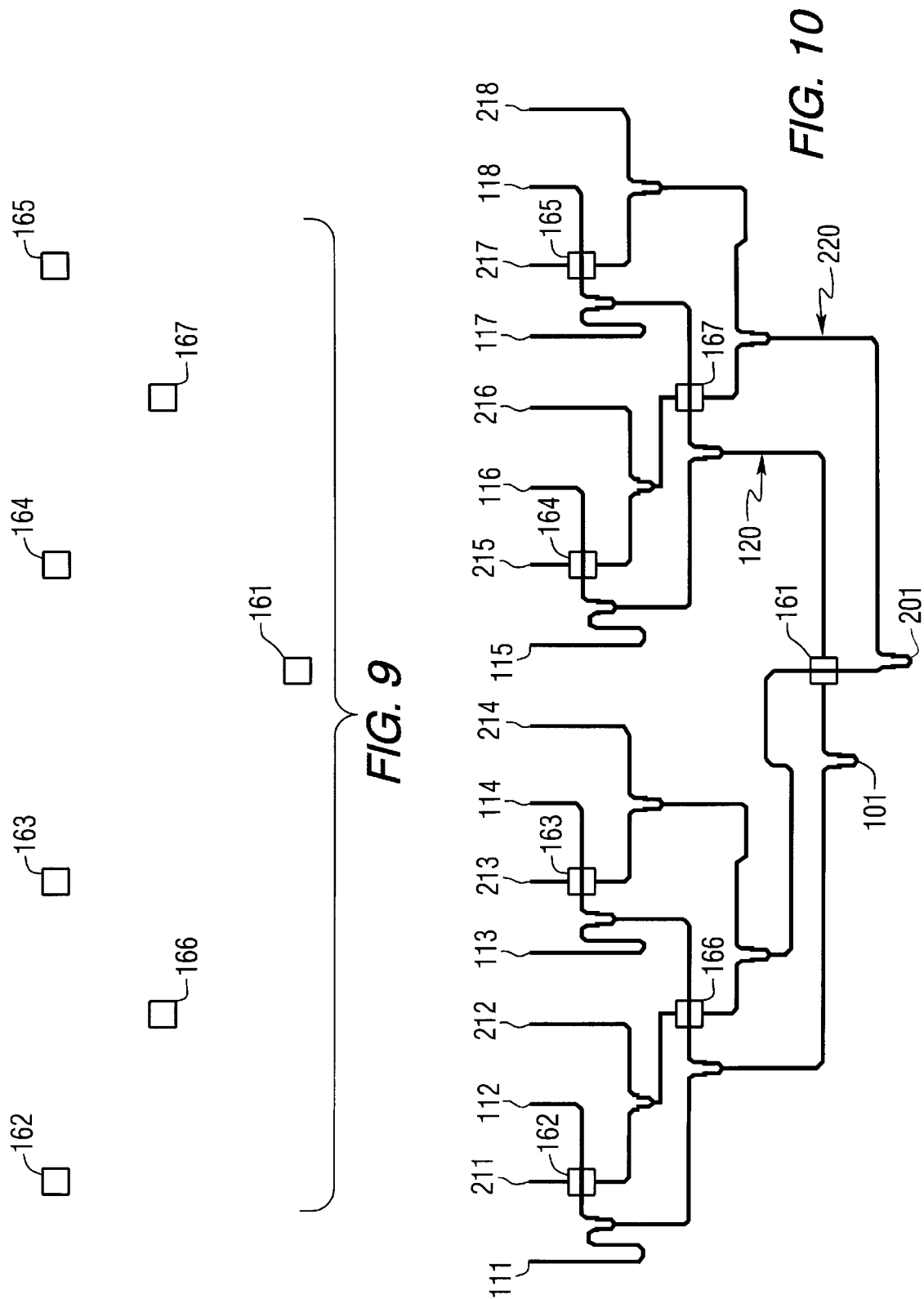

6,097,260

1

DISTRIBUTED GROUND PADS FOR SHIELDING CROSS-OVERS OF MUTUALLY OVERLAPPING STRIPLINE SIGNAL TRANSMISSION NETWORKS

FIELD OF THE INVENTION

The present invention relates in general to communication systems, and is particularly directed to a reduced mass distribution of ground pads for effectively inhibiting cross-coupling of signals between mutually overlapping stripline sections of a multilayer signal transmission architecture, thereby effectively preventing mutual interference therebetween.

BACKGROUND OF THE INVENTION

Modular communication systems, such as those used in spaceborne and airborne applications, typically employ highly compact and densified signal transmission/feed networks, often configured as multilayer stripline architectures, to interconnect various components, such as RF signal processing (amplifier and impedance/phase control) circuits and beam-forming circuits, for a phased array antenna. To minimize size and weight it is common practice to stack multiple layers of microstrip conductor lines, or stripline, closely together as a laminated arrangement of printed circuits. A simplified illustration of such a stripline structure is diagrammatically illustrated in FIGS. 1 and 2 as patterns of conductors 1 and 2 and intermediate dielectric layers 3 (see FIG. 1), that are stacked together to form a multilayer signal transmission architecture.

Because high frequency signal distribution networks, such as those employed for (RF) signalling applications in the hundreds of MHz or into the high (several to tens and above) GHz range, readily couple (radiate and receive) substantial electromagnetic energy in addition to that of the signals propagating through the conductors of the networks, it is necessary to carefully configure and/or space such networks with respect to one another and adjacent system components. In FIGS. 1 and 2, this internal separation is shown by a horizontal spacing 4 and a vertical spacing corresponding to the thickness of a dielectric layer 3 between respective ones of the conductors 1 and 2. As far as the external environment is concerned, the unwanted signal coupling problem is addressed by the use of (grounded) shielding layers, shown at 5 and 6 in FIG. 1.

However, within the multilayer structure itself it can be expected that conductors of the respective networks will cross over or overlap one another at one or more locations, one of which is shown at 7 in FIG. 2. Because of the relatively reduced vertical separation between the conductors of the respective layers of the laminate, unwanted mutual coupling or cross-talk between the networks will occur at these cross-over points. A customary practice to solve this cross-talk problem is diagrammatically illustrated in FIG. 3, and involves the insertion of an interposed shielding (grounded) layer 8, such as a layer of copper or the like (and an associated dielectric layer 3) between each stripline transmission layer. The dielectric shielding layer is shown as dielectrically isolated from conductor layers 1 and 2 by dielectric layers 3 therebetween. Outer grounded shielding layers shown at 5 and 6 are respectively disclosed atop and beneath the conductors 1 and 2 by means of dielectric layers 3 therebetween.

Unfortunately, these additional shielding and dielectric layers not only add weight but substantially increase the overall thickness of the laminate. This creates the need for

2 a trade-off between the thickness of the dielectric layers and the lossiness of the stripline. Namely, because the effective impedance of the stripline is dependent upon its proximity to a ground layer, in order to maintain a desired characteristic line impedance (e.g., fifty ohms, nominal) it is necessary to reduce the line width of the stripline as the thickness of the dielectric layer is decreased. However, narrowing the stripline increases its resistance and therefore its 'lossiness'.

SUMMARY OF THE INVENTION

In accordance with the present invention, the above-described problems of conventional stripline shielding schemes are successfully addressed by a distributed ground pad-based isolation arrangement, which effectively inhibits mutual coupling of signals between overlapping regions of adjacent stripline networks without substantially increasing either the mass of the laminate structure or the lossiness of the stripline.

Pursuant to the invention, wherever stripline layers of dielectrically separated transmission networks mutually overlap, the stripline layers are arranged so that they are spatially oriented at right angles to one another so as to minimize the area of mutual coupling of one section of stripline to another. In addition, at each region of mutual overlap, a limited area ground pad is interleaved between the stripline layers. Each ground pad may comprise a conductive layer (e.g., copper) selectively patterned on either of mutually facing surfaces of a pair of dielectric layers, on opposite surfaces of which the stripline layers are formed. By limited area is meant that while the size of the ground pad may be larger than the actual area of mutual overlap between the two sections of stripline, it need only be as large as necessary to prevent mutual coupling at the overlap region as determined by the parameters of the stripline layers.

In order to maintain the desired characteristic line impedance of the stripline (e.g., fifty ohms, nominal) as it passes over a ground pad, the width of the stripline layer is reduced in the overlap region. Although this reduced line width increases the resistance of the stripline in this region, because the overlap area is relatively small, the overall lossiness of the stripline is not substantially increased. Each ground pad layer is electrically connected to an external ground reference by means of one or more copper-plated vias that extend through the dielectric layers of the laminate structure and intersect grounded shielding layers formed on outer surfaces of the laminate.

In a composite architecture containing multiple stripline transmission networks and one or more intermediate arrangements of ground pads in accordance with the present invention, each network will be able to distribute input signals to its intended plurality of output ports without signals distributed by any one network being coupled to any of the output ports of any other network.

BRIEF DESCRIPTION OF THE DRAWINGS

FIGS. 7 and 8 are plan views of respective overlapping eight-way power dividers of a composite multilayer signal distribution stripline architecture;

FIG. 9 shows a spatial arrangement of the ground pads of FIGS. 4–6, that coincide with stripline cross-over locations of the eight-way power dividers of FIGS. 7 and 8; and FIG. 10 shows the eight-way power dividers of FIGS. 7 and 8, and the spatial arrangement of ground pads of FIG. 9 overlaid in a composite multilayer signal distribution stripline architecture.

DETAILED DESCRIPTION OF THE PREFERRED EMBODIMENT

As described above, the distributed ground pad-based isolation arrangement of the present invention is configured to effectively inhibit the mutual coupling of signals between overlapping regions of adjacent stripline networks within a multilayer signal transmission and distribution architecture. For purposes of reducing the complexity of the drawings, a two network architecture will be described as a non-limiting example. It is to be understood, however, that the invention is not limited to use with this or any particular number of signal distribution networks that may be arranged or stacked in mutually overlapping relationship within a laminate structure.

Figure 4:
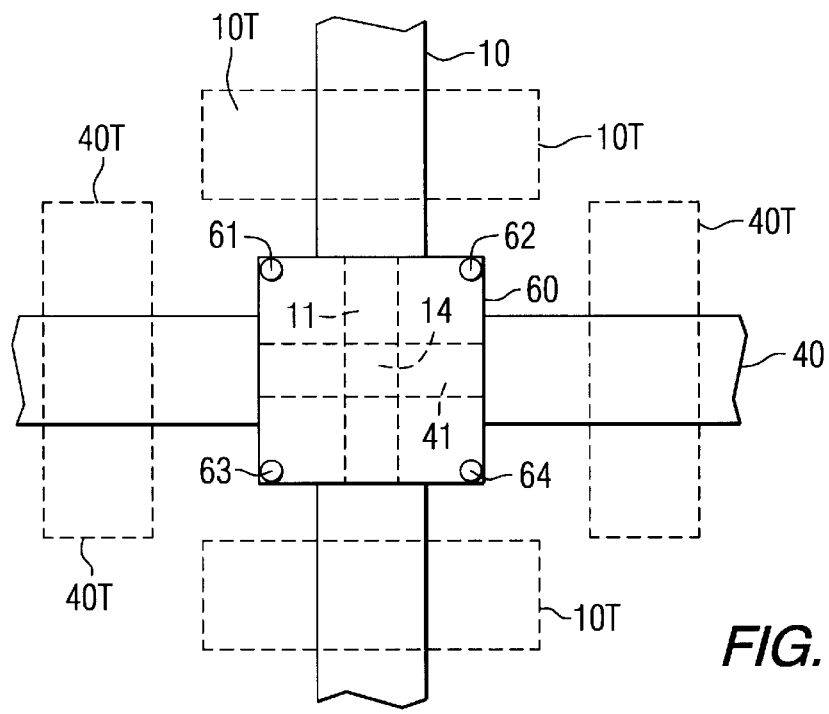
FIGS. 4, 5 and 6 are diagrammatic plan, side and perspective views, respectively, of a multilayer laminate architecture employing an isolating ground pad of the present invention.
Figure 5:
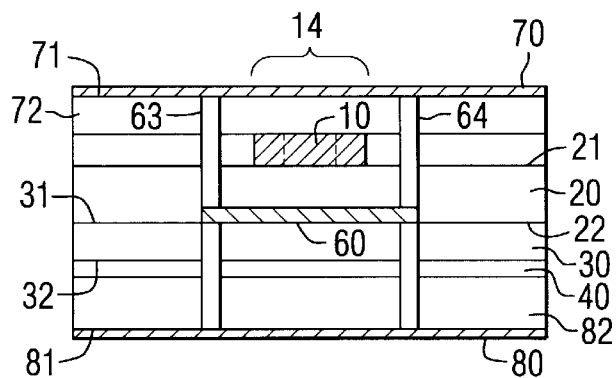
Figure 6:
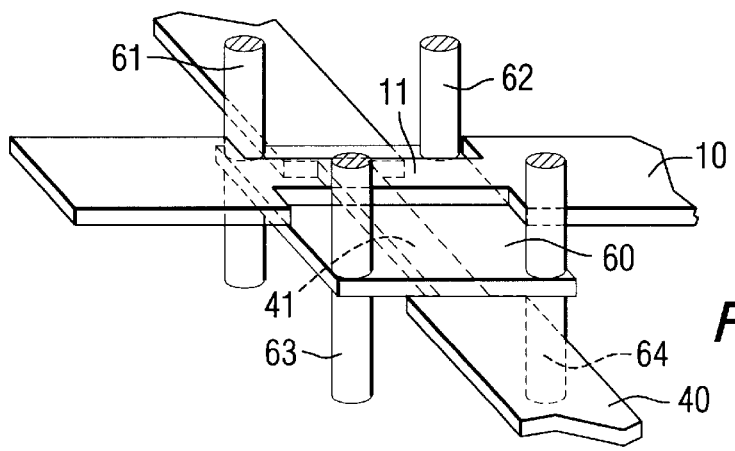

Attention is now directed to FIGS. 4, 5 and 6, which are respective diagrammatic plan, perspective and side views of a multilayer laminate architecture employing one or more isolating ground pads of the present invention, configured to support a pair of generally parallel, and overlapping, signal distribution networks such as those used to feed the respective elements of a pair of phased array antennas. As shown therein, within the multilayer laminate structure, a first signal distribution network includes a layer of stripline 10, such as a layer of fifty-ohm copper transmission line, that is patterned on the first (top) side 21 of a first dielectric layer 20, as shown in FIG. 5. As best seen in FIG. 5, a second side 22 of the first dielectric layer 20 overlies a first side 31 of a second dielectric layer 30. A second signal transmission network comprises a second layer of stripline 40 patterned on a second (bottom) side 32 of the second dielectric layer 30, as shown in FIG. 5, such that one or more regions of the patterned stripline layer 40 overlap one or more regions of the patterned stripline layer 10.

In accordance with the present invention, wherever the routing of the stripline layers 10 and 40 causes them to mutually overlap, the stripline layers are arranged so that they are spatially oriented at right angles to one another, as shown at region 14 (see FIGS. 4 and 5), which serves to minimize the area of mutual coupling of one section of stripline to another. In addition, at each area of mutual overlap 14, a conductive (ground) pad 60 is selectively interleaved between the first dielectric layer 20 and the second dielectric layer 30. The ground pad 60 may comprise a layer of copper selectively formed (e.g., patterned) on either the second surface 22 of dielectric layer 20, or the first surface 31 of the dielectric layer 30.

Although, the ground pad 60 is shown as being larger than the actual area of mutual overlap 14 between the two stripline layers 10 and 40, it need only be as wide as necessary to prevent mutual coupling at the overlap region 14, and is based upon the parameters of the stripline layers. As described briefly above, and as shown by dotted lines 11 and 41 in the plan view of FIG. 4 and also in FIG. 6, each of the stripline layers has a reduced width in the overlap region. Namely, those portions of the two stripline layers 10 and 40, respectively, within projections of the ground pad 60 on each section of stripline in the overlap region 14 are of reduced width, so as to maintain the desired characteristic line impedance (e.g., fifty ohms, nominal) across the overlap region 14, where they are in spatial proximity with a respective ground pad 60.

Figure 1:
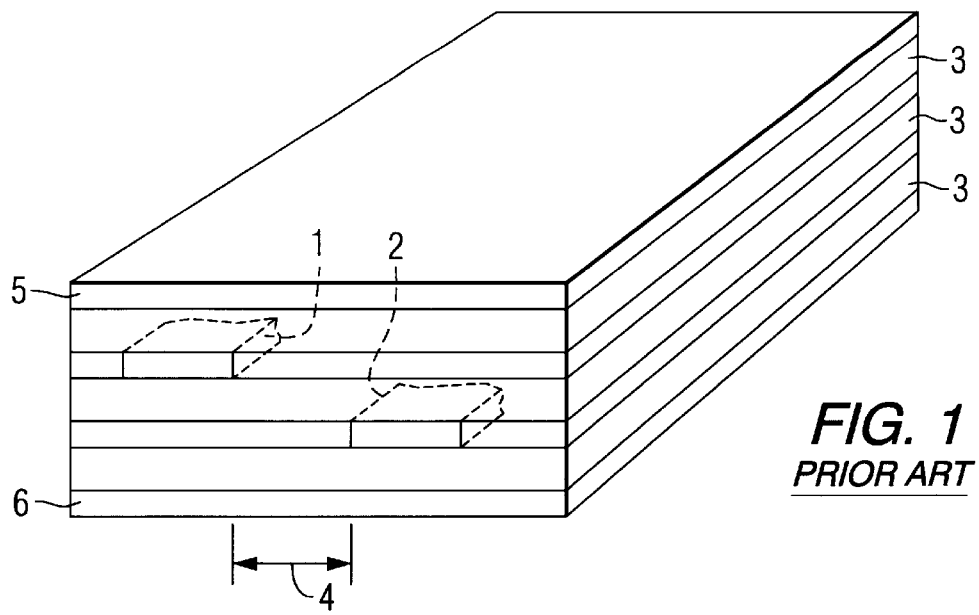
FIGS. 1 and 2 are simplified diagrammatic perspective and plan illustrations of a conventional laminated signal distribution architecture containing overlapping stacked stripline layers.
Figure 2:
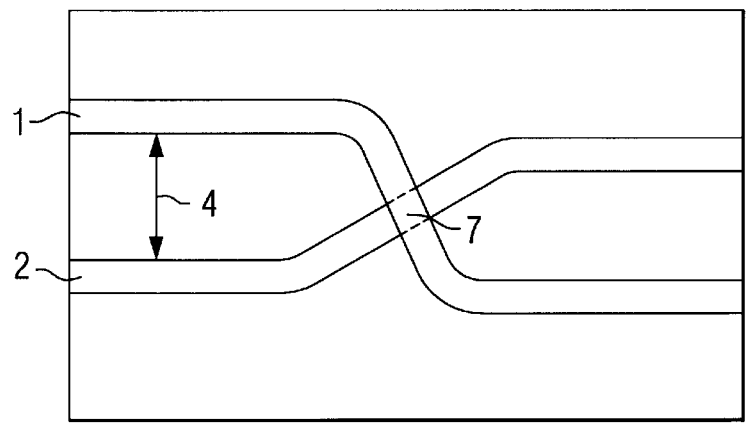
Figure 3:
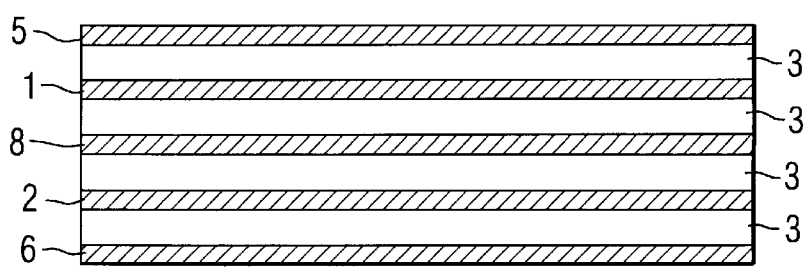
FIG. 3 is a diagrammatic side view of a conventional laminated signal distribution architecture having a continuous shielding layer between adjacent signal distribution layers.

The reduced width regions 11 and 41 are short relative to the entire length of each stripline. Consequently, these regions do not substantially increase the overall lossiness of each layer of stripline, as in the case of using the ubiquitous ground layer of the shielding structure of FIG. 3, described above. To complete its shielding function, ground pad layer 60 is electrically connected to an external ground reference, as by way of a plurality of (copper-) plated vias, four of which are shown at 61, 62, 63 and 64 in FIGS. 4 and 6, extending through the dielectric layers of the laminate structure and intersect grounded shielding layers 70 and 80 formed on outer surfaces 71 and 81 of respective dielectric layers 72 and 82, as best seen in FIG. 5.

Since the plated vias are distributed at peripheral locations of the ground pad 60, surrounding the region of mutual overlap 14 of the two stripline layers, the grounded vias effectively form a shielding 'cage' around the overlap region, and enhancing cross-over isolation. It should also be noted that additional plated vias interconnecting the grounded shielding layers 70 and 80 may be distributed throughout the laminate structure. To reduce discontinuity effects parallel tuning stubs, such as those shown at 40T and 10T in FIG. 4, may be provided at quarter wavelength spacings from the region of mutual overlap 14.

FIGS. 7 and 8 are plan views of respective mutually overlapping eight-way power dividers of a composite multilayer signal distribution stripline architecture shown in FIG. 10, while FIG. 9 shows a distribution of ground pads of the type shown in FIGS. 4–6, to be inserted between the networks of FIGS. 7 and 8, for providing isolation at respective mutual cross-over locations therebetween. In particular, FIG. 7 (and likewise in the mutual overlapping view of FIG. 10) shows a first eight-way power divider 100, having an input port 101, to which a first signal is supplied, and a plurality of (eight) output ports 111, 112, 113, 114, 115, 116, 117, 118, from which a first plurality of output signals corresponding to divided versions of the first signal at port 101 are to be derived.

For this purpose, a first stripline-configured signal distribution network 120 is coupled between the input port 101 and the plurality of output ports 111, 112, 113, 114, 115, 116, 117, 118, and is configured to divide the first signal into eight output signals at output ports 111, 112, 113, 114, 115, 116, 117, 118. In the example shown in FIG. 7, there are seven locations, encircled at 121, 122, 123, 124, 125, 126, 127, where the stripline of the network 120 will mutually overlap sections 221, 222, 223, 224, 225, 226, 227 of stripline of a signal distribution network 220 of FIG. 8, when the two networks are overlaid upon one another to produce the laminate network architecture of FIG. 10. At each of the locations 121, 122, 123, 124, 125, 126, 127 of mutual overlap, the stripline of the network 120 is patterned so that it is oriented in a direction orthogonal to the direction of the stripline of the network 220.

FIG. 8 (and likewise the mutual overlap view of FIG. 10) shows a second eight-way power divider 200 having an input port 201, to which a second signal is supplied, and a plurality of (eight) output ports 211, 212, 213, 214, 215, 216, 217, 218, from which a plurality of output signals corresponding to divided versions of the second signal are to be derived. A second stripline distribution network 220 is coupled between the input port 201 and the plurality of output ports 211, 212, 213, 214, 215, 216, 217, 218, and is configured to distribute the divided second signal as eight output signals at ports 211 211, 212, 213, 214, 215, 216, 217, 218. In the signal distribution network 220 of FIG. 8, there are seven locations, shown encircled at 221, 222, 223, 224, 225, 226, 227, where sections of the stripline of the network 220 will mutually overlap stripline sections 121, 122, 123, 124, 125, 126, 127 of the signal distribution network 120 of FIG. 7, when the two networks are overlaid upon one another to produce the laminate network architecture of FIG. 10. At each of the locations 221, 222, 223, 224, 225, 226, 227 of mutual overlap with the network 120 of FIG. 7, the stripline 220 is patterned so that it is oriented in a direction orthogonal to the direction of the stripline of the network 120 of FIG. 7.

FIG. 9 shows a spatial arrangement of ground pads 161, 162, 163, 164, 165, 166, 167, each of which is configured as a ground pad 60 of FIGS. 4–6, that coincide with the locations 121, 122, 123, 124, 125, 126, 127 and 221, 222, 223, 224, 225, 226, 227 of mutual overlap between the eight-way power dividers 100 and 200 of FIGS. 7 and 8, respectively. As described above, for a dual stripline laminate structure, this spatial arrangement of ground pads may comprise a layer of copper that is selectively patterned on either the second surface 22 of dielectric layer 20 (the top surface 21 of which may contain the eight-way power divider network 100 of FIG. 7), or the first surface 31 of the dielectric layer 30 (the bottom surface 32 of which may contain the eight-way power divider network 200 of FIG. 8).

As can be seen FIG. 10, interleaving the respective eight-way power dividers 100 and 200 of FIGS. 7 and 8 with the distribution of ground pads 161, 162, 163, 164, 165, 166, 167 of FIG. 9 in a composite architecture yields a multilayer stripline structure containing two mutually isolated eight-way power dividers. Since the ground pads 161, 162, 163, 164, 165, 166, 167 of the spatial arrangement of FIG. 9 coincide with the locations 121/221, 122/222, 123/223, 124/224, 125/225, 126/226 127/227 of the seven stripline isolation cross-overs of the signal distribution network 120 of FIG. 7 and the network 220 of FIG. 8, each of the signal distribution networks 120 and 220 will distribute input signals to its intended plurality of output ports, without signals distributed by power divider 100 being coupled to any of the output ports of power divider 200, and without signals distributed by power divider 200 being coupled to any of the output ports of power divider 100.

As will be appreciated from the foregoing description, the above-described cross-talk problem encountered in highly compact and densified multilayer RF signal distribution/feed networks is successfully addressed by the selectively distributed ground pad arrangement of the present invention, which is configured to effectively prevent signals from being mutually coupled between adjacent stripline networks, without the need for an intermediate ubiquitous grounded shielding layer between adjacent ones of the stacked signal distribution networks.

This allows respectively different spatial configurations of various signal distribution network employing the ground pad isolation scheme of the present invention to be defined such that adjacent networks, when mutually overlaid in the laminate structure, provide separate access to signal input ports, and allow the respective output ports thereof to be placed in a desired spatial arrangement, such as at antenna elements of a phased array antenna, but without signals distributed by any one network being coupled to any of the output ports of any other network.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein, but intend to cover all such changes and modifications as are obvious to one of ordinary skill in the art.

What is claimed:

1. A signal coupling network comprising:
    a first conductor, spaced apart from a second conductor by dielectric material therebetween, and crossing over said second conductor at a plurality of regions of mutual overlap therebetween; and
    a plurality of ground pads spaced apart from one another and respectively disposed between said first and second conductors at corresponding ones of said plurality of regions of mutual overlap of said first and second conductors; and wherein
    a plurality of plated vias are connected to a respective ground pad at peripheral locations thereof, so as to effectively provide a respective shielding cage around a respective region of mutual overlap between said first and second conductors.

2. A signal coupling network according to claim 1, wherein, at said plurality of regions of mutual overlap, said first and second conductors are spatially oriented at right angles to one another.

3. A signal coupling network according to claim 1, wherein said first and second conductors are reduced in size at said plurality of regions of mutual overlap, so as to maintain a prescribed characteristic impedance.

4. A multilayer stripline architecture comprising:
    first and second input ports to which first and second signals are respectively supplied;
    a first plurality of output ports from which a first plurality of output signals corresponding to divided versions of said first signal are derived;
    a second plurality of output ports from which a second plurality of output signals corresponding to divided versions of said second signal are derived; and
    a stripline-configured signal distribution network coupling said first and second input ports, respectively, with said first and second pluralities of output ports, and being operative to divide said first signal into said first plurality of output signals, and to divide said second signal into said second plurality of output signals, respectively, while preventing said first signal from being coupled to said second plurality of output ports, and preventing said second signal from being coupled to said first plurality of output ports, said stripline-configured signal distribution network comprising
    a first dielectric layer having a first side and a second side opposite to said first side thereof;
    a first stripline layer extending on said first side of said first dielectric layer;
    a second dielectric layer having a first side and a second side opposite to said first side thereof and arranged adjacent to said first dielectric layer so that the second sides of said first and second dielectric layers face each other;
    a second stripline layer extending on said first side of said second dielectric layer, and crossing over said first stripline layer at a plurality of regions of mutual overlap therebetween, such that, at said regions of mutual overlap, said first and second stripline layers are spatially oriented at right angles to one another; and a plurality of ground pads spaced apart from one another and respectively disposed between said second sides of said first and second dielectric layers at corresponding ones of said plurality of regions of mutual overlap of said first and second stripline layers, said plurality of ground pads being electrically connected to an external ground reference by conductive material extending through said first and second dielectric layers; and wherein a plurality of plated vias are connected to a respective ground pad at Peripheral locations thereof so as to effectively provide a respective shielding cage around a respective region of mutual overlap between said first and second stripline layers.

5. A multilayer stripline architecture according to claim 4, wherein said first and second stripline layers are reduced in size in said plurality of regions of mutual overlap, so as to maintain a prescribed characteristic impedance.

6. A stripline cross-over isolation architecture comprising:

a first dielectric layer having a first side and a second side opposite to said first side thereof;

a first stripline layer extending on said first side of said first dielectric layer;

a second dielectric layer having a first side and a second side opposite to said first side thereof and arranged adjacent to said first dielectric layer so that the second sides of said first and second dielectric layers face each other;

a second stripline layer extending on said first side of said second dielectric layer, and crossing over said first stripline layer at a plurality of regions of mutual overlap therebetween; and a plurality of ground pads spaced apart from one another and respectively disposed between said second sides of said first and second dielectric layers at corresponding ones of said plurality of regions of mutual overlap of said first and second stripline layers, said Plurality of ground pads being electrically connected to an external ground reference by conductive material extending through said first and second dielectric layers; and wherein a plurality of plated vias are connected to a respective around pad at peripheral locations thereof, so as to effectively provide a respective shielding cage around a respective region of mutual overlap between said first and second stripline layers.

7. A stripline cross-over isolation architecture according to claim 6, wherein, at said plurality of regions of mutual overlap, said first and second stripline layers are spatially oriented at right angles to one another.

8. A stripline cross-over isolation architecture according to claim 6, wherein said first and second stripline layers are reduced in size in said plurality of regions of mutual overlap, so as to maintain a prescribed characteristic impedance.

* * * * *